(12) United States Patent
Ito

(10) Patent No.: US 11,183,915 B2
(45) Date of Patent: Nov. 23, 2021

(54) ELECTRIC ELEMENT

(71) Applicant: Murata Manufacturing Co., Ltd., Nagaokakyo (JP)

(72) Inventor: Shingo Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 341 days.

(21) Appl. No.: 16/509,669

(22) Filed: Jul. 12, 2019

(65) Prior Publication Data

US 2019/0341835 A1 Nov. 7, 2019

Related U.S. Application Data

(63) Continuation of application No. PCT/JP2018/006504, filed on Feb. 22, 2018.

(30) Foreign Application Priority Data

Mar. 1, 2017 (JP) .............................. JP2017-038551

(51) Int. Cl.
*H02K 33/18* (2006.01)
*H02K 3/26* (2006.01)
*H02K 15/04* (2006.01)

(52) U.S. Cl.
CPC ............... *H02K 33/18* (2013.01); *H02K 3/26* (2013.01); *H02K 15/0407* (2013.01)

(58) Field of Classification Search
CPC ....... H02K 33/18; H02K 3/26; H02K 15/0407
USPC .......................................................... 310/25
See application file for complete search history.

(56) References Cited

U.S. PATENT DOCUMENTS

| | | | |
|---|---|---|---|
| 2007/0190881 A1 | 8/2007 | Shibaoka et al. |
| 2011/0169347 A1 | 7/2011 | Miyamoto et al. |
| 2013/0222101 A1 | 8/2013 | Ito et al. |
| 2017/0135206 A1 | 5/2017 | Ueda et al. |

FOREIGN PATENT DOCUMENTS

| | | | |
|---|---|---|---|
| JP | 2000-152378 A | 5/2000 |
| JP | 2003-299184 A | 10/2003 |
| JP | 2005-525031 A | 8/2005 |
| JP | 2009-10268 A | 1/2009 |

(Continued)

OTHER PUBLICATIONS

Official Communication issued in International Patent Application No. PCT/JP2018/006504, dated May 15, 2018.

*Primary Examiner* — Terrance L Kenerly
(74) *Attorney, Agent, or Firm* — Keating & Bennett, LLP

(57) ABSTRACT

An electric element includes a substrate including a resin layer and a first conductive body, and a magnet. The substrate includes a first principal surface facing the magnet. The first conductive body includes a coil portion having a winding axis orthogonal to the first principal surface and located on a side closest to the first principal surface. The coil portion includes a continuous coil conductor including a first coil surface facing the first principal surface and a second coil surface opposite to the first coil surface. The coil conductor has a non-uniform thickness in a winding axis direction varying a distance between the first and second coil surfaces, and a difference of maximum and minimum values of distance between the first coil surface and the first principal surface is smaller than a difference of maximum and minimum values of distance between the second coil surface and the first principal surface.

20 Claims, 11 Drawing Sheets

(56) References Cited

FOREIGN PATENT DOCUMENTS

| | | |
|---|---|---|
| JP | 2012-248630 A | 12/2012 |
| JP | 2016-9854 A | 1/2016 |
| WO | 03/094571 A2 | 11/2003 |
| WO | 2005/085508 A1 | 9/2005 |
| WO | 2010/026883 A1 | 3/2010 |

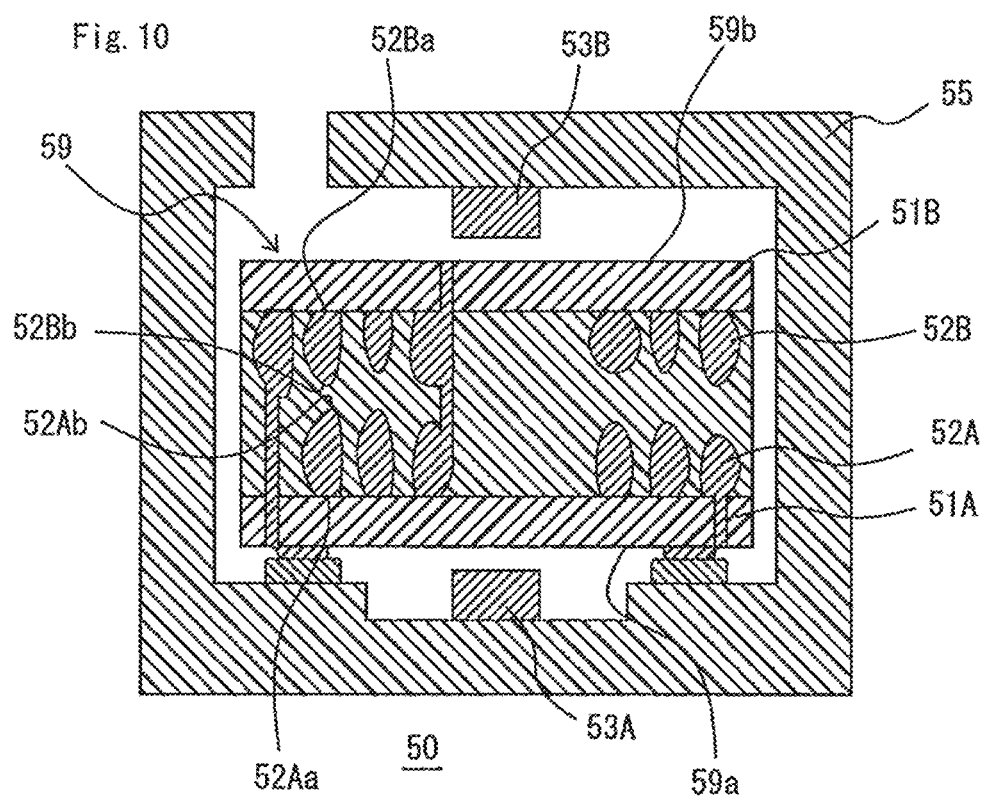

ELECTRIC ELEMENT

CROSS REFERENCE TO RELATED APPLICATIONS

This application claims the benefit of priority to Japanese Patent Application No. 2017-038551 filed on Mar. 1, 2017 and is a Continuation Application of PCT Application No. PCT/JP2018/006504 filed on Feb. 22, 2018. The entire contents of each application are hereby incorporated herein by reference.

BACKGROUND OF THE INVENTION

1. Field of the Invention

The present disclosure relates to an electric element.

2. Description of the Related Art

In a known planar coil structure, a printed circuit board technique is applied to a structure of a coil component. For example, Japanese Laid-Open Patent Publication No. 2012-248630 describes a coil component including a planar spiral conductor formed by electroplating on both surfaces of a substrate.

SUMMARY OF THE INVENTION

Preferred embodiments of the present invention provide electric elements. An electric element according to a preferred embodiment of the present invention includes a substrate including a resin layer and a first conductive body including a contact surface in contact with the resin layer, and a magnet. The substrate includes a smooth first principal surface facing the magnet. The first conductive body includes a coil portion that has a winding axis disposed orthogonal or substantially orthogonal to the first principal surface and that is located on a side closest to the first principal surface. The coil portion includes a continuous coil conductor including a first coil surface facing the first principal surface and a second coil surface opposite to the first coil surface. The coil conductor has a non-uniform thickness in a winding axis direction varying a distance between the first coil surface and the second coil surface along a winding direction, and a difference of a maximum value and a minimum value of distance between the first coil surface and the first principal surface is smaller than a difference of a maximum value and a minimum value of distance between the second coil surface and the first principal surface.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10 is an exemplary cross-sectional view of an electric element according to a fifth preferred embodiment of the present invention.

DETAILED DESCRIPTION OF THE PREFERRED EMBODIMENTS

Figure 12:
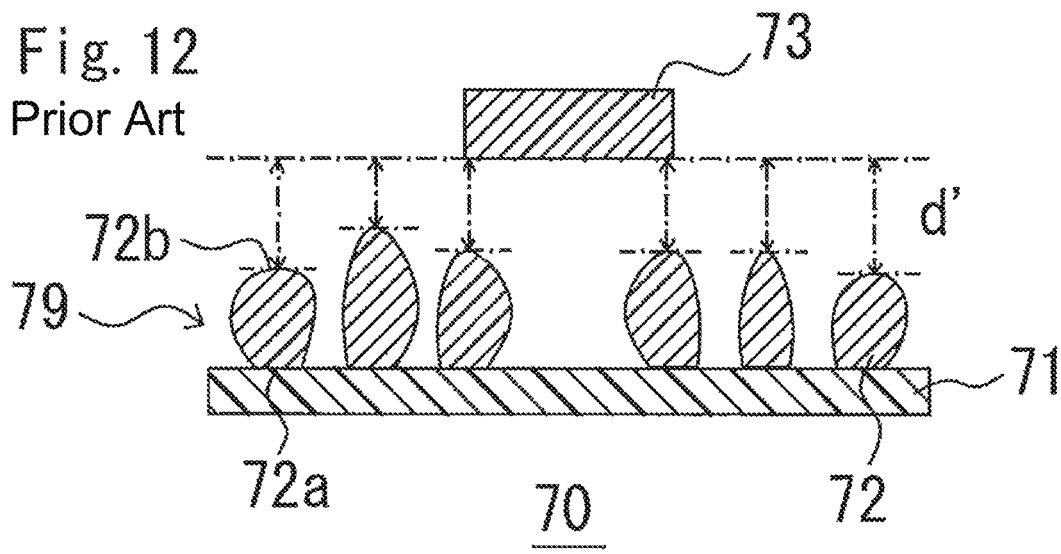
FIG. 12 is an exemplary cross-sectional view of an electric element according to a prior art.

If a planar spiral conductor is formed by electroplating, a coil pattern having a large aspect ratio, i.e., ratio of a conductor thickness to a conductor width, is able to be efficiently obtained. However, if a conductor pattern is formed by electroplating, a rate of growth of the conductor by electroplating tends to vary, so that the conductor pattern is likely to have a nonuniform conductor thickness, and particularly, when a conductor pattern with a large conductor thickness is formed, a difference in conductor thickness tends to be large. When applied to an electric element to be used with a magnet, a coil component having such a conductor pattern causes a problem in that a characteristic difference becomes large between electric elements due to a large difference in conductor thickness. For example, an electric element 70 shown in FIG. 12 includes a substrate 79 in which a coil conductor 72 is disposed on one surface of an insulating base material layer 71, and a magnet 73. The coil conductor 72 is formed through plating growth of a conductor from the one surface of the insulating base material layer 71 in a direction opposite to the other surface. The coil conductor 72 includes a first coil surface 72a in contact with the insulating base material layer 71 and a second coil surface 72b on the opposite side, and variations in rate of growth of the conductor by electroplating make a distance from the first coil surface 72a to the second coil surface 72b nonuniform along a winding direction of a coil. Therefore, the electric element 70 has a large difference in distance from a surface of the magnet 73 facing the substrate 79 to the second coil surface 72b of the coil conductor 72 between conductor portions. In such an electric element, an interaction between an electromagnetic field generated from the coil and the magnet is brought into a nonuniform state depending on a distance difference between the magnet and the second coil surface. Additionally, since a difference in plating growth rate also occurs between manufacturing lots, the electric element including the substrate 79 as described above has a characteristic difference occurring between electric elements. In view of this problems, preferred embodiments of the present invention provide an electric element that is capable of reducing a characteristic difference between electric elements.

An electric element according to a preferred embodiment of the present invention may include a substrate including a resin layer and a first conductive body including a contact surface in contact with the resin layer, and a magnet. The substrate includes a smooth first principal surface facing the magnet. The first conductive body includes a coil portion that has a winding axis disposed orthogonal or substantially orthogonal to the first principal surface and that is located on a side closest to the first principal surface. The coil portion includes a continuous coil conductor including a first coil surface facing the first principal surface and a second coil surface opposite to the first coil surface. The coil conductor has a non-uniform thickness in a winding axis direction varying a distance between the first coil surface and the second coil surface along a winding direction, and a difference of a maximum value and a minimum value of distance between the first coil surface and the first principal surface is smaller than a difference of a maximum value and a minimum value of distance between the second coil surface and the first principal surface.

In an electric element according to a preferred embodiment of the present invention, the coil portion of the first conductive body defining the substrate has a difference due to unevenness on the first coil surface side smaller than a difference due to unevenness of the coil conductor on the second coil surface side. Since the magnet is disposed on the first principal surface side facing the first coil surface, variation is able to be reduced or prevented in difference in distance from the magnet to the first coil surface between electric elements. Therefore, the electric element having stable characteristics is able to be efficiently manufactured. The difference between the maximum value and the minimum value of the distance between the first coil surface and the first principal surface is calculated by subtracting the minimum value from the maximum value, and the same applies to the difference between the maximum value and the minimum value of the distance between the second coil surface and the first principal surface.

The coil conductor may have an average value of about 1 or more of a ratio of a thickness in the winding axis direction to a thickness in a width direction orthogonal or substantially orthogonal to the winding axis direction and the winding direction. The coil conductor has a conductor thickness that is a thickness in the winding axis direction, and a conductor width that is a width in a direction orthogonal or substantially orthogonal to the winding axis direction, in a cross section orthogonal or substantially orthogonal to the winding direction. Since the coil conductor has an average value of about 1 or more of an aspect ratio that is a ratio of the conductor thickness to the conductor width, the cross-sectional area of the coil conductor is able to be made larger while the number of turns of the coil pattern is further increased. As a result, the strength of the electromagnetic field generated by the coil conductor is able to be increased, and the electric element having a larger driving force is able to be provided. The average value of the aspect ratio is obtained as an arithmetic average of five arbitrary positions.

The coil portion may preferably have an average value of about 0.5 or less of a ratio of a gap between adjacent portions of the coil conductor to a thickness in the winding axis direction of one of the portions of the coil conductor. The coil portion include the conductor portions of the continuous coil conductor provided adjacently to each other. By increasing the conductor thickness of the coil conductor and reducing the gap between the adjacent coil conductor portions, the cross-sectional area of the coil conductor is able to be made larger while the number of turns of the coil pattern is further increased. As a result, the strength of the electromagnetic field generated by the coil conductor is able to be increased, and the electric element having a larger driving force and a small conductor loss is able to be provided. The average value of the ratio of the gap between the conductor portions to the thickness in the winding axis direction of one of the coil conductor portions is obtained as an arithmetic average of five arbitrary positions.

The electric element may preferably have an average value of the distance between the first principal surface and the first coil surface that is smaller than the minimum value of the distance between the first coil surface and the second coil surface. As a result, the electric element having a larger driving force and a small conductor loss is able to be provided. The average value of the distance between the first principal surface and the first coil surface is obtained as an arithmetic average of five arbitrary positions.

The coil portion may preferably have a planar spiral shape. As a result, the electric element having a larger driving force is able to be provided. In this case, the planar spiral shape means a shape having an inner circumferential portion and an outer circumferential portion provided by spirally winding a continuous conductive body substantially on the same plane. The term "substantially on the same plane" means that the spiral shape is not continuously extended in the winding axis direction. In the planar spiral shape, the conductive body may be spirally wound to include a linear portion or may be spirally wound to define a circular or elliptical curve.

The substrate may preferably include a first insulating base material layer including two smooth opposite surfaces, one of the surfaces of the first insulating base material layer may define the first principal surface, and the first conductive body may be disposed such that the first coil surface is in contact with the other surface of the first insulating base material layer. In the first insulating base material layer, the two surfaces orthogonal or substantially orthogonal to the layer thickness direction are each smooth. The first conductive body is disposed such that the first coil surface is in contact with the smooth surface of the first insulating base material layer, and therefore, the first coil surface of the first conductive body is smooth and disposed substantially on the same plane. As a result, the distance between the magnet and the first coil surface becomes substantially uniform along the winding direction of the coil, and the characteristics become more stable.

The substrate may preferably include the first conductive body embedded in the resin layer and include a smooth second principal surface opposite to the first principal surface, the substrate may include a second conductive body embedded on the second principal surface side in the resin layer and connected to the first conductive body, the second conductive body may include a coil portion that has a winding axis disposed orthogonal or substantially orthogonal to the second principal surface and that is located on a side closest to the second principal surface, and the coil portion of the second conductive body may include a continuous coil conductor including a third coil surface facing the second principal surface and a fourth coil surface opposite to the third coil surface. Since the substrate includes the second conductive body in addition to the first conductive body, the electric element having a larger driving force is able to be provided.

The coil conductor of the coil portion of the second conductive body may preferably have a non-uniform thickness in the winding axis direction varying a distance between the third coil surface and the fourth coil surface along the winding direction, and a difference of a maximum value and a minimum value of distance between the third coil surface and the second principal surface may be smaller than a difference of a maximum value and a minimum value of distance between the fourth coil surface and the second principal surface. As a result, the electric element having stable characteristics is able to be provided even when a magnet is disposed on the second principal surface side.

The coil conductor of the coil portion of the second conductive body may preferably have an average value of about 1 or more of a ratio of a thickness in the winding axis direction to a thickness in a width direction orthogonal or substantially orthogonal to the winding axis direction and the winding direction. As a result, the cross-sectional area of the coil conductor is able to be made larger while the number of turns of the coil pattern is further increased in the coil portion of the second conductive body, and the strength of the electromagnetic field generated by the coil conductor is able to be increased, so that the electric element having a larger driving force and a small conductor loss is able to be provided.

The coil portion of the second conductive body may preferably have an average value of about 0.5 or less of a ratio of a gap between adjacent portions of the coil conductor to a thickness in the winding axis direction of one of the portions of the coil conductor. As a result, the cross-sectional area of the coil conductor is able to be made larger while the number of turns of the coil pattern is further increased in the coil portion of the second conductive body, and the strength of the electromagnetic field generated by the coil conductor is able to be increased, so that the electric element having a larger driving force and a small conductor loss is able to be provided.

The electric element may preferably be configured such that an average value of the distance between the second principal surface and the third coil surface is smaller than the minimum value of the distance between the third coil surface and the fourth coil surface. As a result, the electric element having a larger driving force is able to be provided while reducing the overall thickness of the substrate.

The coil portion of the second conductive body may preferably have a planar spiral shape. As a result, an electric element having a larger driving force is able to be provided.

The substrate may preferably include a second insulating base material layer including two smooth opposite surfaces, one of the surfaces of the second insulating base material layer may define the second principal surface, and the second conductive body may be disposed such that the third coil surface is in contact with the other surface of the second insulating base material layer. In the second insulating base material layer, the two surfaces orthogonal or substantially orthogonal to the layer thickness direction are each smooth. The second conductive body is disposed such that the third coil surface is in contact with the smooth surface of the second insulating base material layer, and therefore, the third coil surface of the second conductive body is smooth and disposed substantially on the same plane. As a result, the distance between the magnet disposed on the second principal surface side and the third coil surface of the second conductive body becomes substantially uniform along the winding direction of the coil, and the characteristics become more stable.

The electric element may preferably further include a magnet disposed to face the second principal surface. As a result, the electric element having a larger driving force is able to be provided.

An electric element may preferably include a substrate including a resin layer as well as a first conductive body and a second conductive body including contact surfaces with the resin layer, and at least two magnets disposed with the substrate interposed therebetween. The substrate has smooth first and second principal surfaces respectively facing the magnets. The first conductive body includes a first coil portion that has a winding axis disposed orthogonal or substantially orthogonal to the first principal surface and that is located on a side closest to the first principal surface. The first coil portion includes a continuous first coil conductor including a first coil surface facing the first principal surface and a second coil surface opposite to the first coil surface. The first coil conductor has a non-uniform thickness in a winding axis direction varying a distance between the first coil surface and the second coil surface along a winding direction, and a difference of a maximum value and a minimum value of distance between the first coil surface and the first principal surface is smaller than a difference of a maximum value and a minimum value of distance between the second coil surface and the first principal surface. The second conductive body includes a second coil portion that has a winding axis disposed orthogonal or substantially orthogonal to the second principal surface and that is located on a side closest to the second principal surface. The second coil portion includes a continuous second coil conductor including a third coil surface facing the second principal surface and a fourth coil surface opposite to the third coil surface. The second coil conductor has a non-uniform thickness in a winding axis direction varying a distance between the third coil surface and the fourth coil surface along a winding direction, and a difference of a maximum value and a minimum value of distance between the third coil surface and the second principal surface is smaller than a difference of a maximum value and a minimum value of distance between the fourth coil surface and the second principal surface. As a result, the electric element having stable characteristics and a larger driving force is able to be provided.

Preferred embodiments of the present invention will now be described with reference to the drawings. It is noted that the preferred embodiments described below are exemplary of electric elements including the technical ideas of the present invention, and the present invention is not limited to the electric elements according to preferred embodiments described below. The members described in the claims are not limited to the members of the preferred embodiments in any way. Particularly, the dimensions, materials, shapes, relative arrangements, etc. of the elements and portions described in the preferred embodiments are merely illustrative examples and are not intended to limit the scope of the present invention only thereto unless otherwise specified. In the drawings, the same or corresponding portions are denoted by the same reference numerals. Although the preferred embodiments are separately described for convenience in consideration of ease of explanation or understanding of main points, configurations described in different preferred embodiments may be partially replaced or combined. In second and subsequent preferred embodiments, matters common with the first preferred embodiment will not be described, and only the differences will be described. Particularly, the same or similar advantageous effects according to the same or similar configurations will not be described in each preferred embodiment.

First Preferred Embodiment

Figure 1:
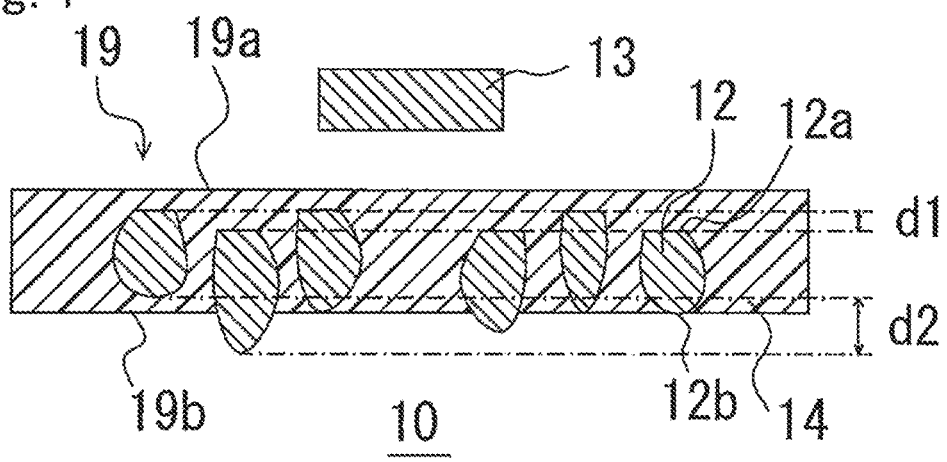
FIG. 1 is an exemplary cross-sectional view of an electric element according to a first preferred embodiment of the present invention.

FIG. 1 is a schematic cross-sectional view of an electric element 10 according to a first preferred embodiment of the present invention. The electric element 10 includes a substrate 19 including a resin layer 14 and a first conductive body 12, and a magnet 13. In the substrate 19, the first conductive body 12 includes a contact surface in contact with the resin layer 14. In FIG. 1, the first conductive body 12 includes a conductive body portion entirely buried in the resin layer 14 and a partially-buried and partially-exposed conductive body portion. The substrate 19 includes a smooth first principal surface 19a facing the magnet 13 and a second principal surface 19b opposite to the first principal surface 19a as two opposite surfaces of the resin layer 14. The first conductive body 12 includes a coil portion having a winding axis disposed orthogonal or substantially orthogonal to the first principal surface 19a. As a result, at least a portion of a magnetic flux from the magnet 13 penetrates the coil portion in the winding axis direction of the coil portion. The coil portion of the first conductive body 12 includes a continuous coil conductor and includes a first coil surface 12a facing the first principal surface and a second coil surface 12b opposite to the first coil surface 12a. The coil conductor has a nonuniform thickness in the winding axis direction varying a distance between the first coil surface 12a and the second coil surface 12b along a winding direction of a coil. For example, in FIG. 1, conductor portions shown in a cross section are different in the thickness in the winding axis direction, i.e., the height in the direction orthogonal or substantially orthogonal to the first principal surface, depending on each of the conductor portions. Additionally, in FIG. 1, a distance is also nonuniform between the first principal surface 19a and the first coil surface 12a of the coil conductor. The coil conductor is configured such that a difference d1 of a maximum value and a minimum value of the distance between the first principal surface 19a and the first coil surface 12a is smaller than a difference d2 of a maximum value and a minimum value of the distance between the first principal surface 19a and the second coil surface 12b. For example, the d1 is preferably 0 μm or more and about 5 μm or less and, for example, the d2 is preferably greater than 0 μm and about 10 μm or less. The first conductive body 12 is preferably made of a metal such as copper, for example, and the resin layer 14 preferably includes at least one of a thermoplastic resin and a thermosetting resin, for example.

In the electric element 10, the first conductive body of the substrate includes the coil portion in which a difference due to unevenness of the coil conductor on the first coil surface side is smaller than a difference due to unevenness of the coil conductor on the second coil surface side, so that variation is able to be reduced or prevented in difference in distance from the magnet 13 disposed on the first principal surface side to the first coil surface 12a between the electric elements. Therefore, the electric element having stable characteristics is able to be efficiently manufactured.

The distance between the first principal surface 19a and the first coil surface 12a in a certain conductive body portion is measured as a minimum value of the distance between a surface parallel or substantially parallel to the first principal surface 19a and in contact with the first coil surface 12a and the first principal surface 19a. The distance between the first principal surface 19a and the second coil surface 12b in a certain conductive body portion is measured as a maximum value of the distance between a surface parallel or substantially parallel to the first principal surface 19a and in contact with the second coil surface 12b and the first principal surface 19a. The distance between the first coil surface 12a and the second coil surface 12b in a certain conductive body portion is measured as a maximum value of the distance between a surface parallel or substantially parallel to the first principal surface 19a and in contact with the first coil surface 12a and a surface parallel or substantially parallel to the first principal surface 19a and in contact with the second coil surface 12b.

The coil conductor having nonuniform thickness in the winding axis direction is able to be obtained by forming the coil conductor by an electroplating method, for example. In FIG. 1, the first coil surface 12a of the coil conductor includes a surface parallel or substantially parallel to the first principal surface 19a, and the second coil surface 12b has a rounded shape. Such a coil conductor is formed through plating growth from the first coil surface 12a side toward the second coil surface 12b side, for example. In the present preferred embodiment, d1 only needs to be smaller than d2, and the first coil surface 12a may have a rounded shape. The substrate 19 shown in FIG. 1 is able to be formed, for example, by causing the plating growth of a coil conductor on a thermoplastic resin layer and then laminating and collectively pressing a thermoplastic resin on the conductive body. While the substrate is able to be formed by a simple process, the conductive body is displaced in the lamination direction due to a flow of the thermoplastic resin during this process. Although the first conductive body 12 is partially exposed from the resin layer 14 in FIG. 1, the entirety of the first conductive body 12 may be embedded in the resin layer 14. The substrate 19 may preferably have a smooth first insulating base material layer on the surface facing the magnet.

The coil portion of the first conductive body 12 may preferably have, for example, a planar spiral shape, or may have a meander coil shape.

The electric element 10 of the first preferred embodiment defines a vibrating element in which the substrate 19 defines and functions as a vibrating plate vibrating in the lamination direction according to a drive current when the drive current is applied between an inner circumferential portion and an outer circumferential portion of the first conductive body 12 with the position of the magnet 13 fixed, for example.

Second Preferred Embodiment

Figure 2:
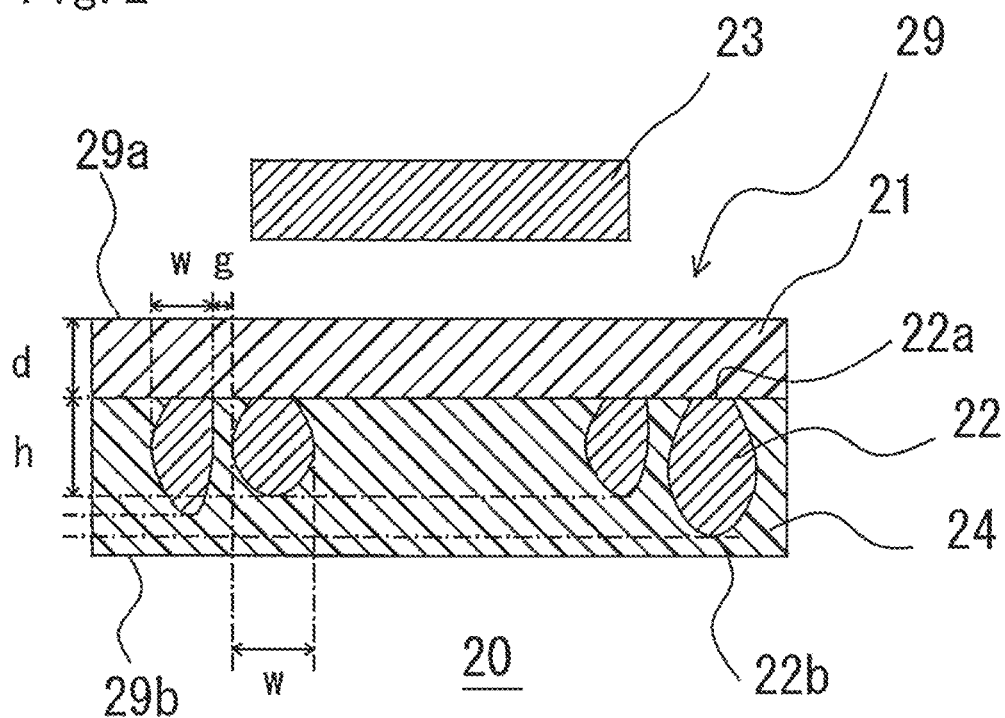
FIG. 2 is an exemplary cross-sectional view of an electric element according to a second preferred embodiment of the present invention.

FIG. 2 is a schematic cross-sectional view of an electric element 20 according to a second preferred embodiment of the present invention. The electric element 20 has the same or substantially the same configuration as the electric element according to the first preferred embodiment except that a first insulating base material layer 21 defined as a flat plate-shaped resin layer having smooth surfaces on both sides is included on the side of a surface of a substrate 29 facing a magnet 23, that a first conductive body 22 is disposed in contact with the first insulating base material layer 21, and that the first conductive body 22 is embedded in a resin layer 24. The substrate 29 includes the first insulating base material layer 21, the first conductive body 22 having a planar spiral shape and disposed on the first insulating base material layer 21, and the resin layer 24 in which the first conductive body is embedded. In the substrate 29, a surface of the first insulating base material layer 21 opposite to a surface in contact with the resin layer 24 is a first principal surface 29a that is smooth and faces the magnet 23. A surface of the resin layer 24 opposite to a surface in contact with the first insulating base material layer 21 is a second principal surface 29b. The first conductive body 22 is in contact with the first insulating base material layer 21 on the surface of the first insulating base material layer 21 facing the resin layer 24. A coil portion of the first conductive body 22 has a planar spiral shape on the first insulating base material layer 21 and includes a continuous coil conductor spirally extending between an inner circumferential portion and an outer circumferential portion of the planar spiral shape. The coil conductor includes a first coil surface 22a in contact with the first insulating base material layer 21 and a second coil surface 22b opposite to the first coil surface 22a. The coil conductor has a distance between the first coil surface 22a and the second coil surface 22b varying along the winding direction of the coil, and the thickness is nonuniform in the winding axis direction. In the substrate 29, the first conductive body 22 is in contact with the flat plate-shaped first insulating base material layer 21, so that the distance between the first principal surface 29a and the first coil surface 22a is constant or substantially constant over the entire or substantially the entire first conductive body 22. Therefore, the difference of the maximum value and the minimum value of the distance between the first principal surface and the first coil surface is zero or substantially zero. On the other hand, the distance between the first principal surface 29a and the second coil surface 22b varies along the winding direction of the coil and is nonuniform. Therefore, the difference of the maximum value and the minimum value of the distance between the first principal surface 29a and the first coil surface 22a is smaller than the difference of the maximum value and the minimum value of the distance between the first principal surface 29a and the second coil surface 22b.

The first conductive body 22 has a thickness h in the winding axis direction along a direction orthogonal or substantially orthogonal to the mounting surface and a width w in a lateral direction on a surface orthogonal or substantially orthogonal to the winding direction of the first conductive body 22, for example, in the cross section of FIG. 2, and includes adjacent conductive body portions arranged with a gap g on the first insulating base material layer 21. The thickness h in the winding axis direction of the first conductive body 22 is measured as a distance between the first coil surface 22a and the second coil surface 22b in a certain conductive body portion. The width w and the gap g are measured as a distance between two surfaces parallel or substantially parallel to the winding axis direction and in contact with a certain conductive body portion. Specifically, the thickness h of a certain conductive body portion is measured as a distance between a surface parallel or substantially parallel to the first principal surface 29a and in contact with the first coil surface 22a and a surface parallel or substantially parallel to the first principal surface 29a and in contact with the second coil surface 22b. The width w is measured as a distance between two surfaces orthogonal or substantially orthogonal to the first principal surface 29a, parallel or substantially parallel to the winding direction, and in contact with a certain conductive body portion. The gap g between the conductive body portions is measured as a distance between two surfaces orthogonal or substantially orthogonal to the first principal surface 29a, parallel or substantially parallel to the winding direction, and in contact with respective facing surfaces of the two adjacent conductive body portions.

In one configuration of the substrate 29, the thickness h in the winding axis direction of the first conductive body 22 is preferably about 30 μm or more and about 45 μm or less, for example; the width w is preferably about 25 μm or more and about 45 μm or less, for example; and the gap g is preferably about 5 μm or more and about 10 μm or less, for example.

In FIG. 2, the thickness h of the first conductive body 22 is not a constant value throughout the first conductive body 22 in the winding direction and is nonuniform due to a position having a value different from another position. The width w of the first conductive body 22 is not a constant value throughout the first conductive body 22 in the winding direction and is nonuniform due to a position having a value different from another position.

The first conductive body 22 includes a position in which an average value of a ratio g/h of the gap g between the adjacent conductive body portions to the thickness h of one of the two adjacent conductive body portions is preferably, for example, about 0.5 or less, and more preferably about 0.3 or less. The thickness h of one of the two conductive body portions is a value of larger one of the respective thicknesses of the conductive body portions. The average value is obtained as an average value of ratios calculated at five arbitrary positions. When the average value of the ratio g/h is equal to or less than the predetermined value, a coil is defined by the conductive body having a narrow gap, so that the coil is able to be increased in the number of turns per unit area.

In the first conductive body 22, an average value of a ratio h/w of the thickness h to the width w is preferably, for example, about 1 or more. When the average value of the ratio h/w is equal to or greater than the predetermined value, a coil is defined by the conductive body with a high aspect ratio, so that the coil is able to be increased in the number of turns per unit area.

The substrate 29 is configured such that an average value of the distance d between the first principal surface 29a and the first coil surface 22a is smaller than the minimum value of the distance between the first coil surface 22a and the second coil surface 22b, i.e., the thickness h in the winding axis direction of the first conductive body 22. As a result, the thickness of the substrate 29 is able to be reduced as a whole. The average value of the distance d between the first principal surface 29a and the first coil surface 22a is obtained as an average value of measured values at five arbitrary positions. In one configuration of the substrate 29, the average value of the distance d is preferably, for example, about 5 μm or more and about 20 μm or less.

Figure 3:
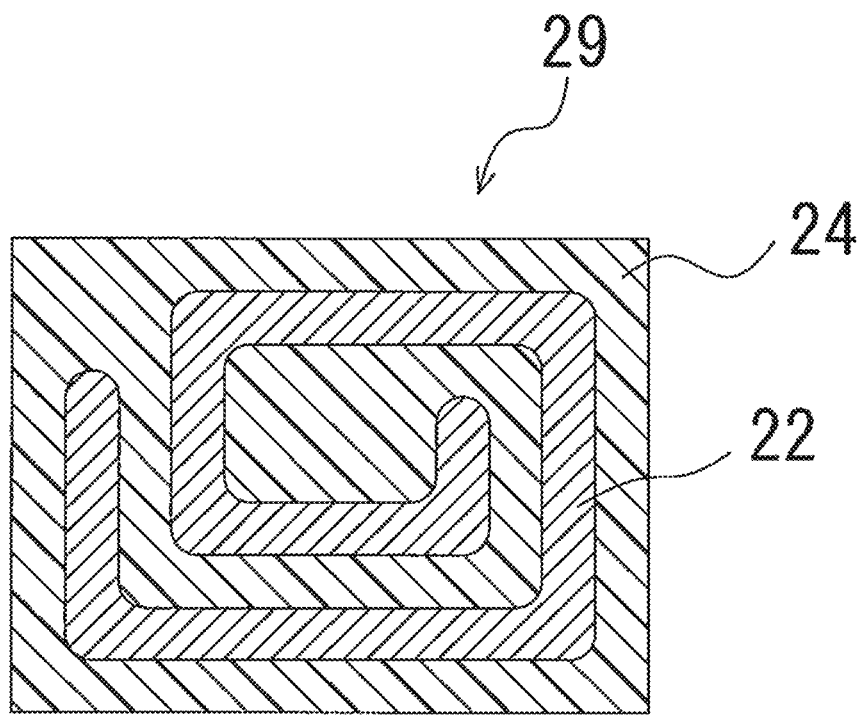
FIG. 3 is an exemplary end view of a substrate used for the electric element according to the second preferred embodiment of the present invention in a planar view.

In the electric element 20, the first conductive body 22 includes the planar spiral-shaped coil portion. FIG. 3 is an exemplary end view of an interface between the first insulating base material layer 21 and the resin layer 24 of the substrate 29 as viewed from the first principal surface side. In FIG. 3, the coil portion of the first conductive body 22 is provided by connecting the inner circumferential portion and the outer circumferential portion through a continuous conductive body spirally extended and arranged on a surface. In FIG. 3, the planar spiral shape preferably has, for example, a rectangular or substantially rectangular shape including orthogonal or substantially orthogonal linear portions such that the linear portions vary in length for each intersecting straight line. However, for example, the planar spiral shape may be a polygonal shape including linear portions or may be a substantially circular shape, a substantially elliptical shape, etc. including curved lines.

Although the first conductive body 22 is embedded in the resin layer 24 in FIG. 2, the substrate 29 may not include the resin layer 24. Specifically, the electric element 20 may include the substrate 29 including the first insulating base material layer 21 that is a resin layer and the first conductive body 22 disposed in contact with the first insulating base material layer 21, and the magnet 23. The substrate 29 may further include a second insulating base material layer on the surface of the resin layer 24 opposite to the surface in contact with the first insulating base material layer 21. The first insulating base material layer and the resin layer 24 may be made of the same material or different materials. The first insulating base material layer 21 may preferably be made of, for example, a thermoplastic resin such as a liquid crystal polymer (LCP) or a thermosetting resin such as an epoxy resin. For example, the resin layer 24 may preferably be made of a slurry insulating resin having fluidity, and the insulating resin may be either a thermoplastic resin or a thermosetting resin. By making the resin layer 24 with a slurry insulating resin having fluidity, the first coil surface 22a is arranged substantially on the same plane without causing a positional displacement of the first conductive body 22 in the lamination direction.

In the electric element 20, the magnet 23 is disposed on the side of the smooth first principal surface 29a of the substrate 29. The magnet 23 is disposed to face the first coil surface 22a that is a contact surface of the first conductive body 22 with the first insulating base material layer 21, and the magnetic flux of the magnet 23 passes through in the winding axis direction of the planar spiral shape of the first conductive body 22. As shown in FIG. 2, in the electric element 20, a difference in the distance between the first coil surface 22a of the first conductive body 22 and the magnet 23 is able to be set within a predetermined range regardless of the thickness of the nonuniform first conductive body 22. In contrast, if the magnet 23 is disposed on the second principal surface side of the substrate 29 in the electric element 20, a difference in the distance between the magnet 23 and the second coil surface 22b of the first conductive body 22 becomes large and varies depending on the thickness of the first conductive body 22 included in the substrate 29 to be manufactured, resulting in variations in characteristics of the electric element 10. Furthermore, in the electric element 20, the first coil surface 22a is in contact with the smooth surface of the first insulating base material layer 21, so that the first coil surface 22a is smooth. As a result, the distance between the magnet 23 and the first coil surface 22a becomes constant or substantially constant along the winding direction of the coil, and the characteristics become more stable.

The electric element 20 of the second preferred embodiment defines a vibrating element in which the substrate 29 defines and functions as a vibrating plate vibrating in the lamination direction according to a drive current when the drive current is applied between the inner circumferential portion and the outer circumferential portion of the first conductive body 22 with the position of the magnet 23 fixed, for example.

Figure 4A:
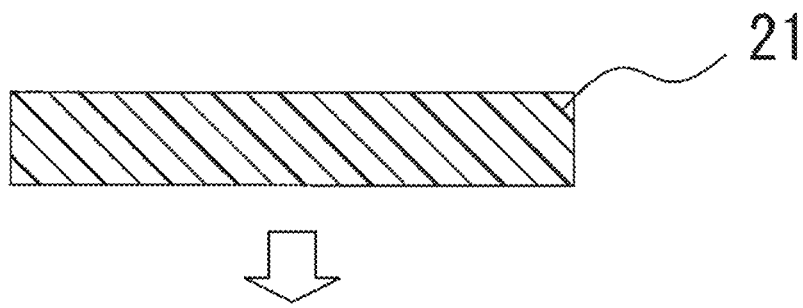
FIG. 4A is a schematic view showing a portion of a manufacturing process of the substrate used for the electric element according to the second preferred embodiment of the present invention.
Figure 4B:
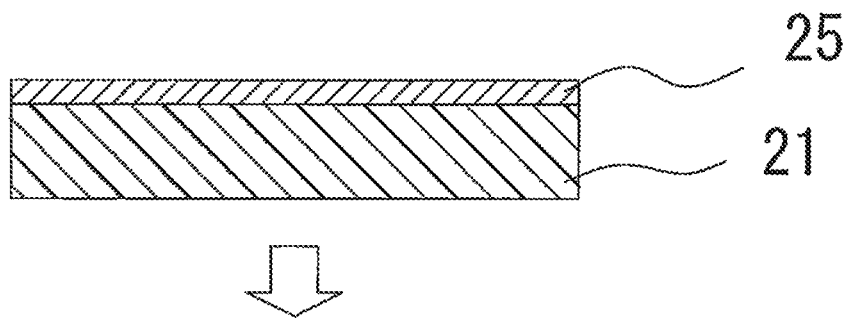
FIG. 4B is a schematic view showing a portion of a manufacturing process of the substrate used for the electric element according to the second preferred embodiment of the present invention.
Figure 4C:
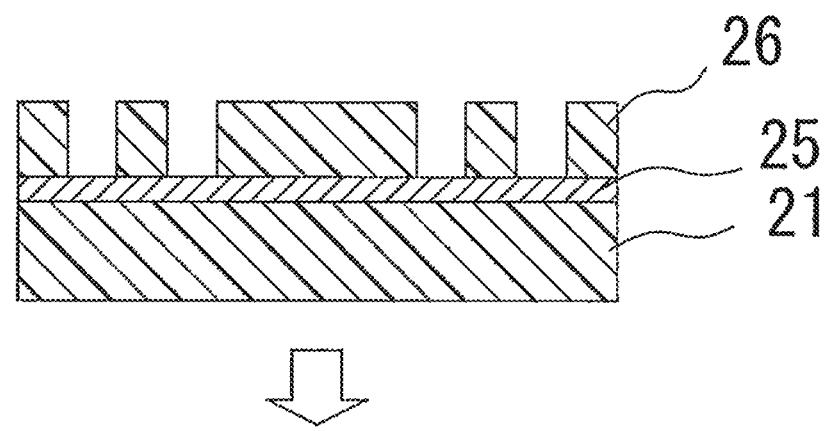
FIG. 4C is a schematic view showing a portion of a manufacturing process of the substrate used for the electric element according to the second preferred embodiment of the present invention.
Figure 4D:
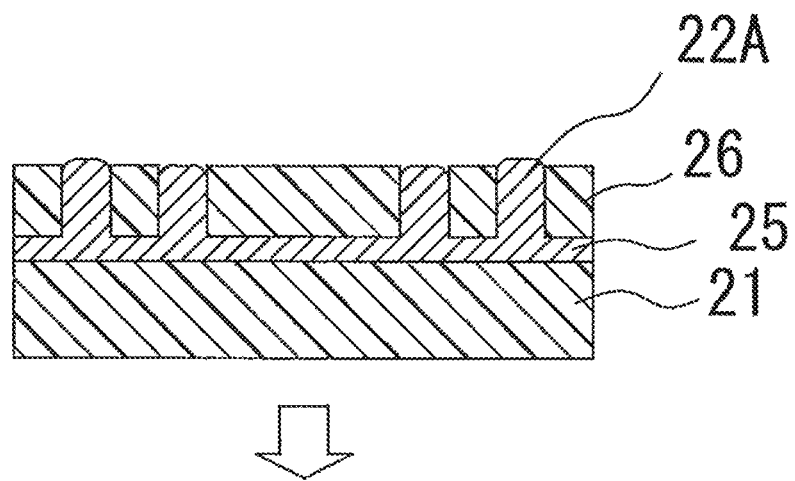
FIG. 4D is a schematic view showing a portion of a manufacturing process of the substrate used for the electric element according to the second preferred embodiment of the present invention.
Figure 4E:
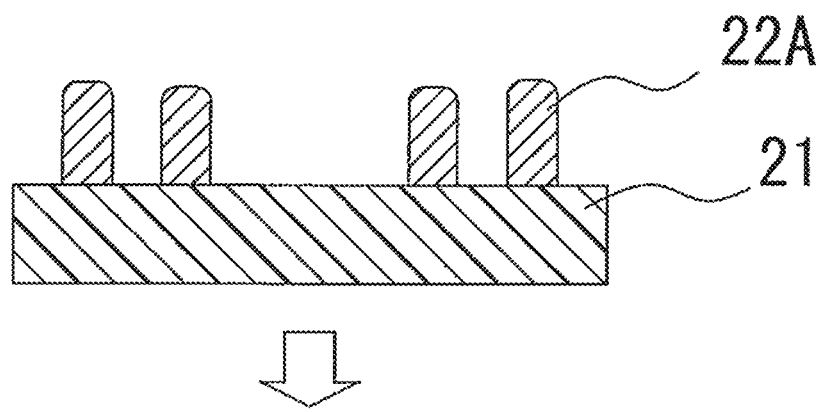
FIG. 4E is a schematic view showing a portion of a manufacturing process of the substrate used for the electric element according to the second preferred embodiment of the present invention.
Figure 4F:
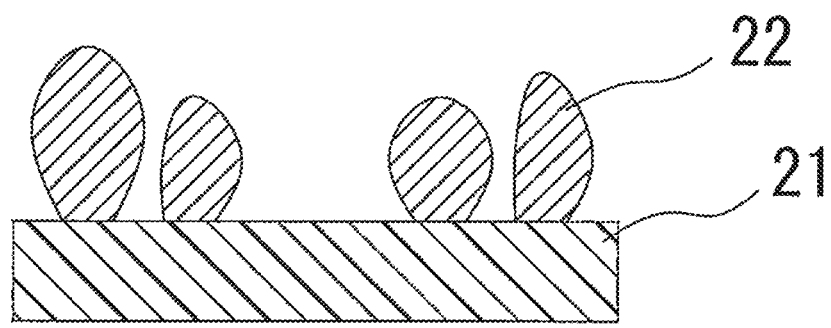
FIG. 4F is a schematic view showing a portion of a manufacturing process of the substrate used for the electric element according to the second preferred embodiment of the present invention.

FIGS. 4A to 4F are schematic views showing a non-limiting example of a manufacturing process of forming the first conductive body 22 having a non-uniform thickness on the first insulating base material layer 21 in the manufacturing process of the substrate 29 used for the electric element 20 according to the second preferred embodiment. In FIG. 4A, the first insulating base material layer is prepared. The first insulating base material layer 21 contains, for example, an insulating thermoplastic resin, such as an epoxy resin and a liquid crystal polymer (LCP), for example. In FIG. 4B, an underlaying metal layer 25 is disposed on one surface of the prepared first insulating base material layer 21. The underlaying metal layer 25 may be disposed by laminating a metal foil with the first insulating base material layer 21 or may be disposed by electroless plating of the first insulating base material layer 21. In FIG. 4C, a resist 26 defining and function as a template of conductive bodies 22A is formed on the underlaying metal layer 25 using photolithography, for example. The resist 26 is formed such that the underlaying metal layer 25 is exposed in a planar spiral shape. In FIG. 4D, the conductive bodies 22A are formed through plating growth on the underlaying metal layer 25 by electroplating. The conductive bodies 22A are formed through plating growth along the shape of the resist 26 in the direction opposite to the first insulating base material layer 21. The conductive bodies 22A formed by electroplating have a thickness slightly varying between adjacent conductive body portions depending on a local variation in plating growth rate and include an uppermost surface, i.e., a growth end portion of the plating growth, forming a curved surface of an arc shape etc. In FIG. 4E, the resist 26 is removed. At the time of removal of the resist 26, the portion of the underlaying metal layer 25 covered with the resist 26 is removed at the same time to expose the first insulating base material layer 21 between the conductive bodies 22A. The underlaying metal layer 25 may be removed by etching, for example. In FIG. 4F, the conductive bodies 22A are further grown by electroplating to form the first conductive body 22. Since the first conductive body 22 is obtained through the plating growth of the conductive bodies 22A, the ratio h/w of the thickness h to the width w in the cross section of the first conductive body 22 is larger than 1, and the thickness h and the width w are nonuniform along the winding direction of the first conductive body. In the first conductive body 22 formed through the plating growth, the gap between the adjacent conductive bodies becomes narrower than before the plating growth.

Figure 5A:
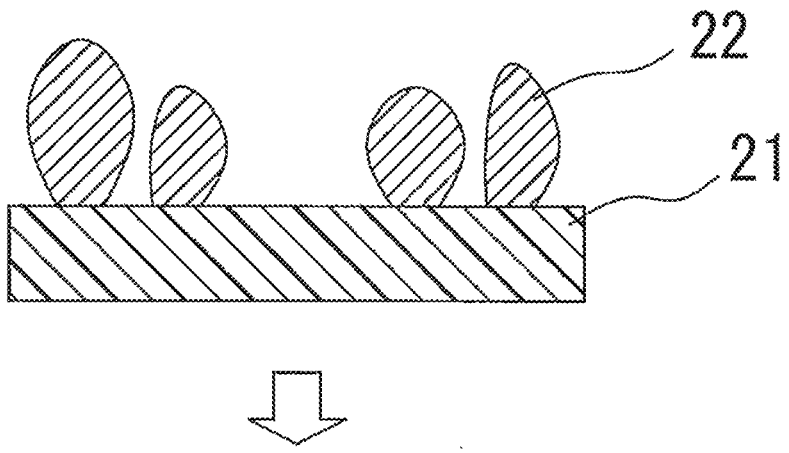
FIG. 5A is a schematic view showing another example of a manufacturing process of a substrate used for an electric element according to a preferred embodiment of the present invention.
Figure 5B:
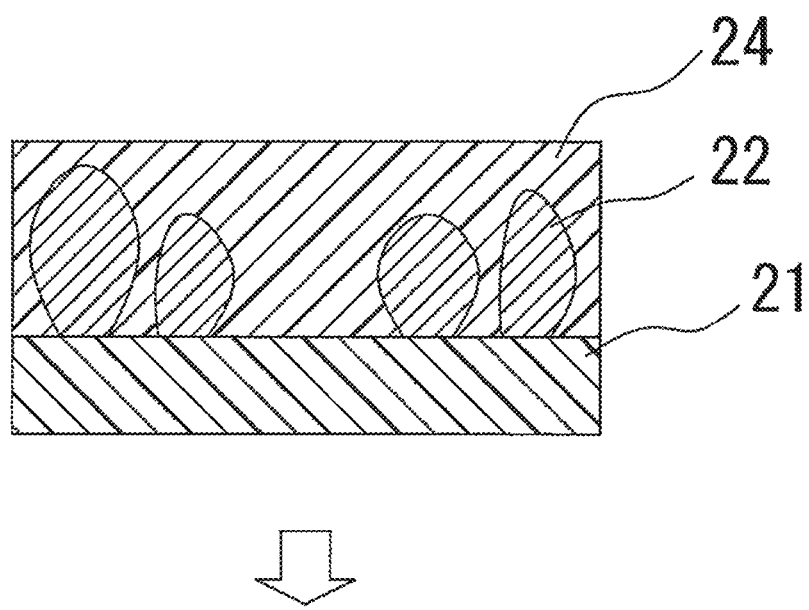
FIG. 5B is a schematic view showing another example of a manufacturing process of a substrate used for an electric element according to a preferred embodiment of the present invention.
Figure 5C:
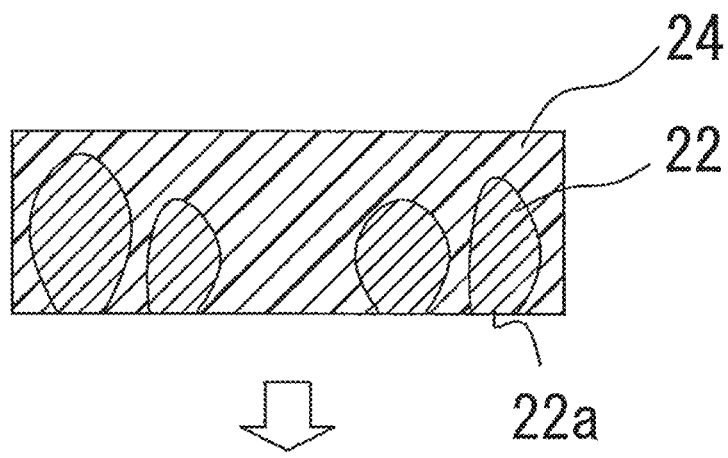
FIG. 5C is a schematic view showing another example of a manufacturing process of a substrate used for an electric element according to a preferred embodiment of the present invention.
Figure 5D:
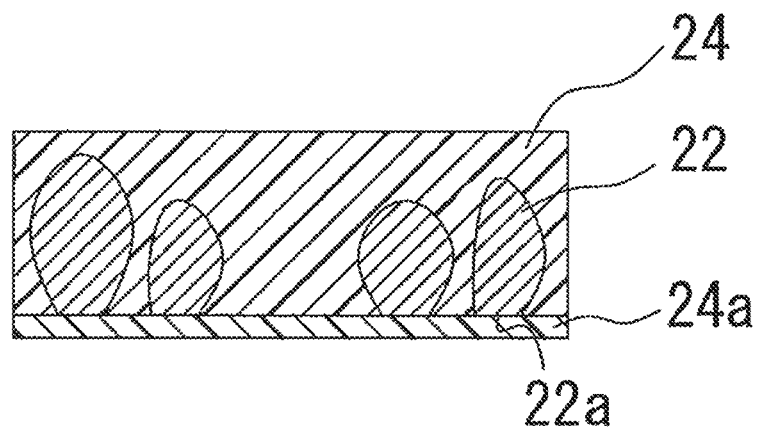
FIG. 5D is a schematic view showing another example of a manufacturing process of a substrate used for an electric element according to a preferred embodiment of the present invention.

FIGS. 5A to 5D are schematic views showing another non-limiting example of the manufacturing process of the substrate applicable to the electric element 20. In FIG. 5A, a substrate manufactured as shown in FIGS. 4A to 4F is prepared, including the first insulating base material layer 21 and the first conductive body 22 disposed in contact with one surface of the first insulating base material layer 21. The electric element 20 may be formed by using the substrate of FIG. 5A. In FIG. 5B, the substrate 19 is formed by laminating the insulating resin layer 24 on the surface of the first insulating base material layer 21 on which the first conductive body 22 is disposed. A slurry material having fluidity may be used for laminating the resin layer 24. Using the slurry material prevents formation of a void between the conductive body portions of the first conductive body 22, and the resin layer 24 leveled without a gap is able to be formed on the first insulating base material layer 21. Furthermore, the first conductive body 22 is restrained from nonuniformly projecting toward a mounting surface due to deformation of the first insulating base material layer 21 at the time of lamination. In FIG. 5C, the first insulating base material layer 21 is peeled from the resin layer 24. By peeling the first insulating base material layer 21, a substrate including the resin layer 24 and the first conductive body 22 including a contact surface in contact with the resin layer 24 is obtained. In the substrate of FIG. 5C, a first coil surface of the first conductive body 22 is exposed on the surface of the resin layer 24 on the mounting surface side. The electric element 20 may be formed using the substrate obtained in FIG. 5C. In FIG. 5D, a resist layer 24a is laminated on the surface of the resin layer 24 on the mounting surface side. The resist layer 24a is configured to contain a thermoplastic resin or a thermosetting resin, for example. The resist layer 24a may be laminated using the same material as the resin layer 24 or may be laminated by using a different material. By disposing the resist layer 24a on the mounting surface side of the resin layer 24, the first coil surface of the first conductive body 22 is covered. The electric element 20 may be formed using the substrate obtained in FIG. 5D.

Third Preferred Embodiment

Figure 6:
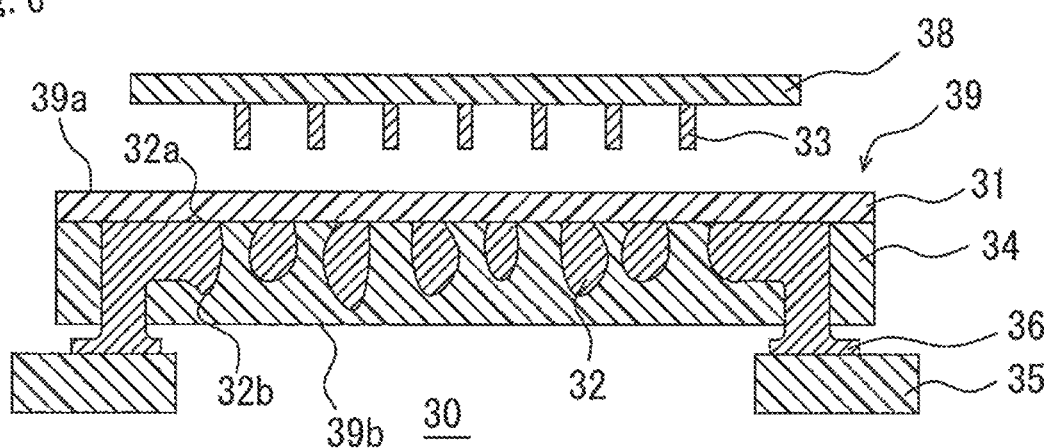
FIG. 6 is an exemplary cross-sectional view of an electric element according to a third preferred embodiment of the present invention.

FIG. 6 is a schematic cross-sectional view of an electric element 30 according to a third preferred embodiment of the present invention. The electric element 30 according to the third preferred embodiment has the same or substantially the same configuration as the electric element 10 or 20 of the first or second preferred embodiment except that a coil portion of a first conductive body 32 in a substrate 39 has a meander coil pattern, that a plurality of magnets 33 is disposed on the side of a first principal surface 39a in accordance with a coil shape, and that the substrate 39 is disposed on a housing 35.

Figure 7:
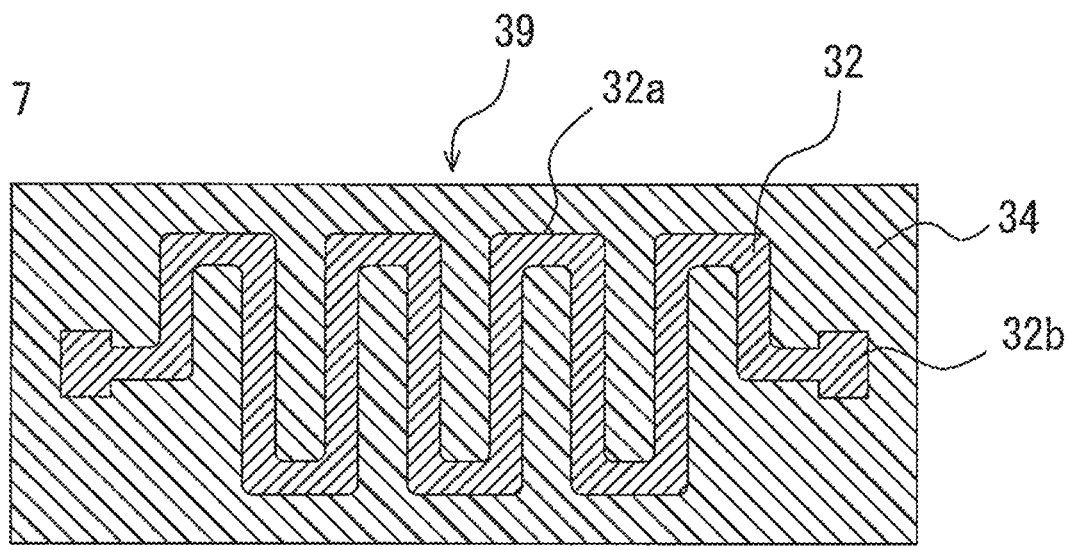
FIG. 7 is an exemplary end view of a substrate used for the electric element according to the third preferred embodiment of the present invention in a planar view.

The electric element 30 includes the substrate 39 including a first insulating base material layer 31 and a first conductive body 32 disposed in contact with one surface of and the first insulating base material layer 31, and the magnets 33 disposed on the first principal surface 39a side of the substrate 39. In the electric element 30, the first conductive body 32 includes a coil portion and connecting portions continuously extended from the coil portion. In the electric element 30, the coil portion of the first conductive body 32 has a coil shape of a meander coil pattern. FIG. 7 is an exemplary end view of an interface between the first insulating base material layer 31 of the substrate 39 and the resin layer 34 as viewed from the first principal surface side. In FIG. 7, a coil portion 32a of the first conductive body 32 defines a meander coil pattern extending while meandering from one end portion to the other end portion. Although the coil portion 32a is configured as a continuous rectangular shape including orthogonal or substantially orthogonal linear portions in FIG. 7, the coil portion may be configured to include continuous curves. Connecting portions 32b integrally provided with the coil portion 32a are disposed at both end portions of the first conductive body 32. The connecting portions 32b of the first conductive body 32 are connected to connection terminals 36 disposed on the housing 35 via a connection material such as solder, for example.

In FIG. 6, a plurality of the magnets 33 is disposed on a surface of a housing 38 facing the first principal surface 39a in accordance with the coil shape of the first conductive body. For example, the magnets 33 are arranged such that adjacent magnets have opposite polarities. The magnets 33 are disposed to face the first coil surface 32a that is a contact surface of the first conductive body 32 with the first insulating base material layer 31, and the magnetic fluxes of the magnets 33 pass through in directions of respective winding axes of the meander coil pattern of the first conductive body 32. The housing 35 includes the connection terminals 36 to which the connecting portions of the first conductive body 32 are connected. When the electric element 30 is incorporated in an electronic device, the connection terminals 36 are connected to a circuit of the electronic device. When a drive current flows through the meander coil pattern of the coil portion of the first conductive body 32 embedded in the substrate 39 via the connecting portions of the first conductive body, the substrate 39 moves in the lamination direction orthogonal or substantially orthogonal to the first principal surface.

Fourth Preferred Embodiment

Figure 8:
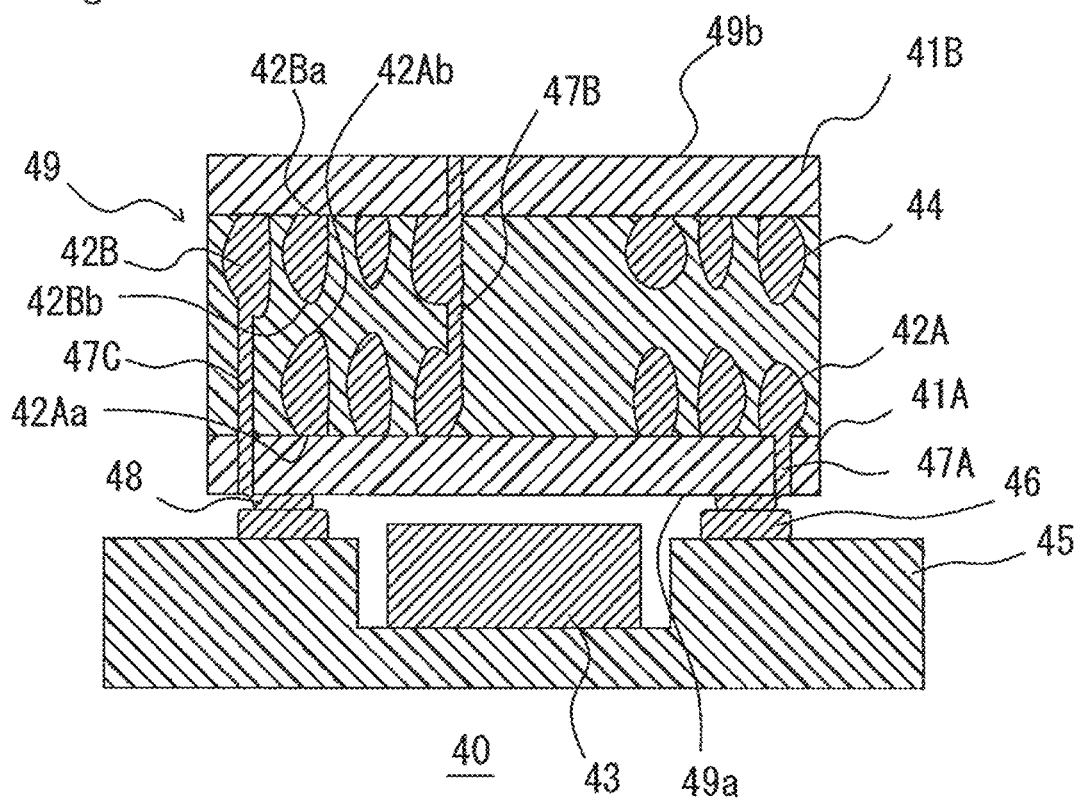
FIG. 8 is an exemplary cross-sectional view of an electric element according to a fourth preferred embodiment of the present invention.

FIG. 8 is a schematic cross-sectional view of an electric element 40 according to a fourth preferred embodiment of the present invention. The electric element 40 according to the fourth preferred embodiment has the same or substantially the same configuration as the mounting substrate 10 or 20 of the first or second preferred embodiment except that a substrate 49 includes a first insulating base material layer 41A, a resin layer 44, and a second insulating base material layer 41B, that the resin layer 44 incorporates a first conductive body 42A as well as a second conductive body 42B connected to the first conductive body 42A and disposed in contact with the second insulating base material layer 41B, and that a housing 45 supporting the substrate 49 and housing a magnet 43 is included. In the electric element 40 according to the fourth preferred embodiment, since the substrate 49 includes two layers of the flat spiral-shaped conductive bodies, an electromagnetic field generated by a driving current becomes larger, so that a larger driving force is able to be obtained.

The electric element 40 includes the substrate 49, the magnet 43, and the housing 45. The substrate 49 includes the first insulating base material layer 41A including smooth surfaces on both sides, the planar spiral-shaped first conductive body 42A disposed in contact with one surface of the first insulating base material layer 41A, the second insulating base material layer 41B sandwiching the resin layer 44 together with the first insulating base material layer 41A and including smooth surfaces on both sides, and the planar spiral-shaped second conductive body 42B disposed in contact with a surface of the second insulating base material layer 41B facing the first insulating base material layer 41A. The first conductive body 42A is disposed such that a first coil surface 42Aa is in contact with the first insulating base material layer 41A, and a second coil surface 42Ab faces a fourth coil surface 42Bb of the second conductive body 42B. The second conductive body 42B is disposed such that a third coil surface 42Ba is in contact with the second insulating base material layer 41B. External connection terminals 48 are disposed on a first principal surface 49a of the substrate 49 on the first insulating base material layer 41A side. The first insulating base material layer 41A and the second insulating base material layer 41B are bonded by the insulating resin layer 44 including the first conductive body 42A and the second conductive body 42B therein. Each of the first conductive body 42A and the second conductive body 42B has a planar spiral shape on the first insulating base material layer 41A or the second insulating base material layer 41B and includes a coil portion including a continuous conductor defining an inner circumferential portion and an outer circumferential portion conductive having a spiral shape. The first conductive body 42A includes the outer circumferential portion connected to the external connection terminal 48 via an internal connection conductor 47A disposed along the lamination direction of the substrate 49 and the inner circumferential portion connected to the inner circumferential portion of the second conductive body 42B via an internal connection conductor 47B. The outer circumferential portion of the second conductive body 42B is connected to the external connection terminal 48 via an internal connection conductor 47C. The external connection terminals 48 are respectively connected to connection terminals 46 disposed on the housing 45. As a result, the one external connection terminal 48 and the other external connection terminal 48 are connected via the first conductive body 42A and the second conductive body 42B.

The housing 45 includes a recess portion in which the magnet 43 is disposed. The magnet 43 is disposed on the side of the first principal surface 49a of the substrate 49, i.e., the surface of the first insulating base material layer 41A opposite to the surface on which the first conductive body 42A is disposed. The magnet 43 is disposed to face the first coil surface 42Aa that is the contact surface of the first conductive body 42A with the first insulating base material layer 41A, and the magnetic flux of the magnet 43 passes through in the winding axis direction of the planar spiral shape of the first conductive body 42A and the second conductive body 42B. The housing 45 includes the connection terminals 46 to which the external terminals of the substrate 49 are connected. When the electric element 40 is incorporated in an electronic device, the connection terminals 46 are connected to a circuit of the electronic device. When a drive current flows through a planar spiral-shaped coil including the coil portions of the first conductive body and the second conductive body embedded in the substrate 49 via the external connection terminals 48, the substrate 49 moves in the lamination direction of the substrate 49.

Although the substrate 49 defining the electric element 40 according to the fourth preferred embodiment includes the planar spiral-shaped conductive bodies including two layers, at least one layer of a planar spiral-shaped conductive body connecting the first conductive body 42A and the second conductive body 42B may further be included between the first conductive body 42A and the second conductive body 42B.

Figure 9A:
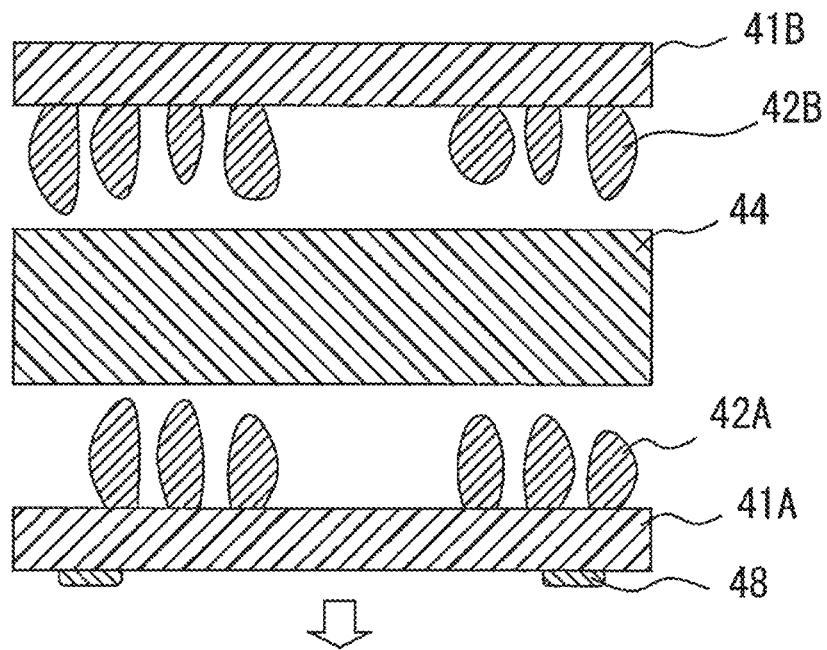
FIG. 9A is a schematic view showing a manufacturing process of a substrate used for the electric element according to the fourth preferred embodiment of the present invention.
Figure 9B:
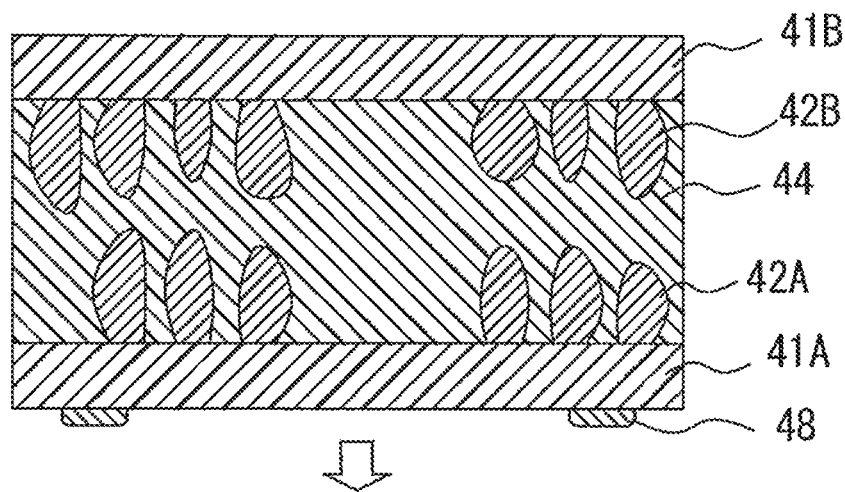
FIG. 9B is a schematic view showing a manufacturing process of a substrate used for the electric element according to the fourth preferred embodiment of the present invention.
Figure 9C:
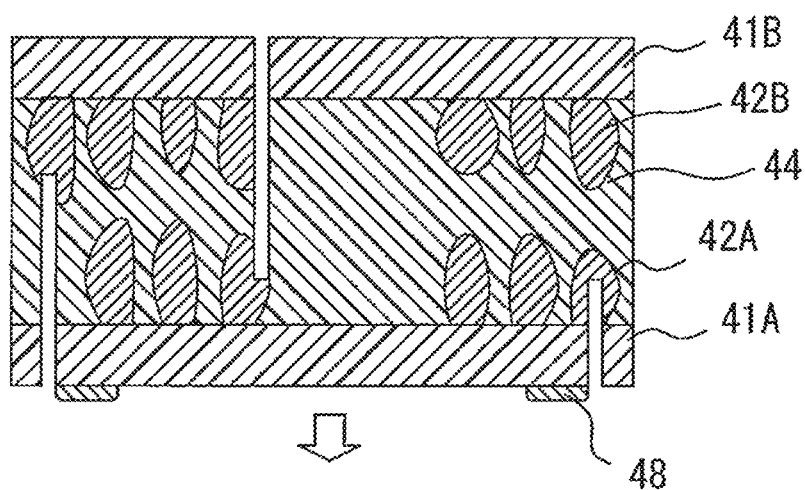
FIG. 9C is a schematic view showing a manufacturing process of a substrate used for the electric element according to the fourth preferred embodiment of the present invention.
Figure 9D:
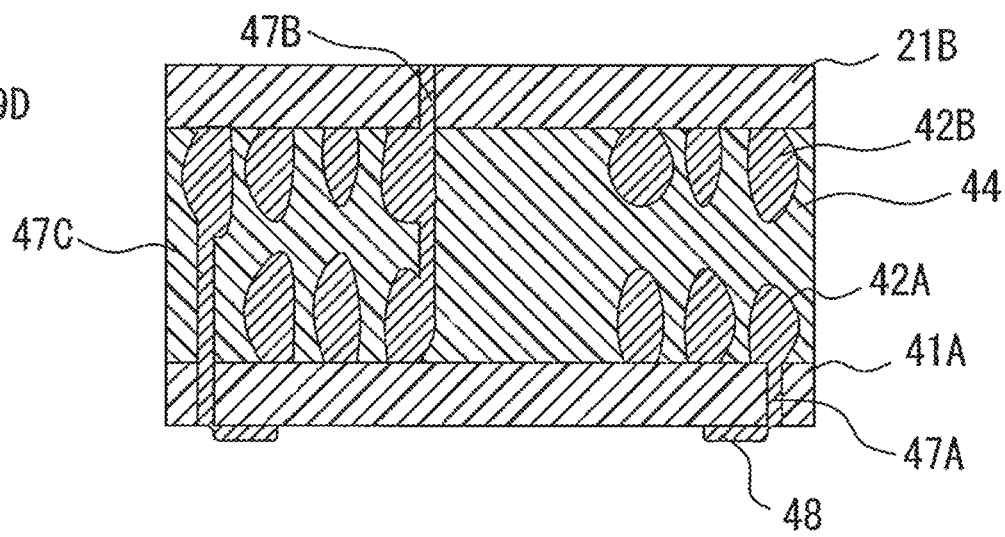
FIG. 9D is a schematic view showing a manufacturing process of a substrate used for the electric element according to the fourth preferred embodiment of the present invention.

FIGS. 9A to 9D are schematic views showing a non-limiting example of a method of manufacturing the substrate 49 used for the electric element 40 according to the fourth preferred embodiment. In FIG. 9A, the first insulating base material layer 41A including one surface disposed with the planar spiral-shaped first conductive body 42A, the insulating resin layer 44, and the second insulating base material layer 41B including one surface disposed with the planar spiral-shaped second conductive body 42A are prepared. The insulating base material layers disposed with the conductive bodies are prepared by the method described above, for example. The external connection terminals 48 are disposed on a mounting surface that is the surface of the first insulating base material layer 41A opposite to the surface on which the first conductive body 42A is disposed. The external connection terminal 48 is formed using a conductive paste, for example. The first insulating base material layer 41A and the second insulating base material layer 41B are disposed such that the respective surfaces provided with the first conductive body 42A and the second conductive body 42B face each other with the resin layer 44 interposed therebetween. The resin layer 44 is formed to have a thickness such that the first conductive body 42A and the second conductive body 42B are included therein. The resin layer 44 may be made of a slurry insulating material having fluidity, for example. Subsequently, a pressure is applied in a direction orthogonal or substantially orthogonal to the first principal surface so that both the first conductive body 42A and the second conductive body 42B are buried in the resin layer 44 as shown in FIG. 9B to obtain a laminated body in which the first insulating base material layer 41A and the second insulating base material layer 41B are bonded via the resin layer 44. In FIG. 9C, a hole penetrating the first insulating base material layer 41A and extending to the conductive body portion of the outer circumferential portion of the first conductive body 42A and a hole penetrating the first insulating base material layer 41A and extending to the conductive body portion of the outer circumferential portion of the second conductive body 42B are formed from the side of the first principal surface that is the surface of the first insulating base material layer 41A opposite to the surface on which the first conductive body 42A is disposed. Additionally, a hole penetrating the second insulating base material layer 41B and extending to the conductive body portion of the inner circumferential portion of the second conductive body 42B and the conductive body portion of the inner circumferential portion of the first conductive body 42A is formed from the surface of the second insulating base material layer 41B opposite to the surface on which the second conductive body 42B is disposed. Each of the holes is formed using a laser or a drill, for example. In FIG. 9D, the internal connection conductors 47A, 47B, and 47C are disposed in the holes formed in FIG. 9C. The internal connection conductors 47A and 47C are respectively also connected to the external connection terminals 48. The internal connection conductors 47A, 47B, and 47C are formed using a plating process or a method of filling with and thermosetting a conductive paste, for example.

Fifth Preferred Embodiment

FIG. 10 is a schematic cross-sectional view of an electric element 50 according to a fifth preferred embodiment of the present invention. The electric element 50 according to the fifth preferred embodiment has the same or substantially the same configuration as the electric element 40 of the fourth preferred embodiment except that a first magnet 53A is disposed on the side of a first principal surface 59a of the substrate 59 while a second magnet 53B is additionally disposed on the side of a second principal surface 59b and that the substrate 59 is disposed inside a housing 55 including an opening portion. The electric element 50 according to the fifth preferred embodiment includes the magnets disposed on both sides of the substrate 59 while having stable characteristics, and therefore, an interaction is further increased between the magnetic field generated from the magnet and the electromagnetic field generated from the conductive body, so that a larger driving force is able to be obtained.

The electric element 50 includes the substrate 59, the first magnet 53A and the second magnet 53B disposed with the substrate 59 interposed therebetween, and the housing 55. The electric element 50 includes the substrate 59 as well as the first magnet 53A and the second magnet 53B built in the housing 55 including the opening portion. The first magnet 53A is disposed to face the first principal surface 59a of the substrate 59, i.e., a surface of a first insulating base material layer 51A opposite to a surface on which a first conductive body 52A is disposed in contact therewith. The second magnet 53B is disposed to face the second principal surface 59b of the substrate 59, i.e., a surface of a second insulating base material layer 51B opposite to a surface on which a second conductive body 52B is disposed in contact therewith. In the substrate 59, the first principal surface 59a and the second principal surface 59b are smooth.

The first conductive body 52A includes a first coil portion that has a winding axis disposed orthogonal or substantially orthogonal to the first principal surface 59a and that is located on a side closest to the first principal surface 59a. The first coil portion includes a continuous first coil conductor including a first coil surface 52Aa facing the first principal surface 59a and a second coil surface 52Ab opposite to the first coil surface. The first coil conductor has an uneven thickness in the winding axis direction varying a distance between the first coil surface 52Aa and the second coil surface 52Ab along the winding direction, so that a difference of a maximum value and a minimum value of the distance between the first coil surface 52Aa and the first principal surface 59a is smaller than a difference of a maximum value and a minimum value of the distance between the second coil surface 52Ab and the first principal surface 59a. The second conductive body 52B includes a second coil portion that has a winding axis disposed orthogonal or substantially orthogonal to the second principal surface 59b and that is located on a side closest to the second principal surface 59b. The second coil portion includes a continuous second coil conductor including a third coil surface 52Ba facing the second principal surface 59b and a fourth coil surface 52Bb opposite to the third coil surface. The second coil conductor has an uneven thickness in the winding axis direction varying a distance between the third coil surface 52Ba and the fourth coil surface 52Bb along the winding direction, so that a difference of a maximum value and a minimum value of the distance between the third coil surface 52Ba and the second principal surface 59b is smaller than a difference of a maximum value and a minimum value of the distance between the fourth coil surface 52Bb and the second principal surface 59b.

In the electric element 50, the distance from the first coil surface 52Aa of the first conductive body 52A defining and functioning as the contact surface in contact with the first insulating base material layer 51A to the first magnet 53A and the distance from the third coil surface 52Ba of the second conductive body 52B defining and functioning as the contact surface in contact with the second insulating base material layer 51A to the magnet 53B are each able to be stably set regardless of the non-uniform thicknesses in the winding axis direction of the first conductive body 52A and the second conductive body 52B. Therefore, an interaction state of the electromagnetic fields generated by the substrate 59 for both the first magnet 53A and the second magnet 53B is able to be stably controlled within a predetermined range, so that the electric element 50 having stable characteristics is able to be provided.

In the electric element 50, the first conductive body 52A is disposed such that the first coil surface 52Aa is in contact with the first insulating base material layer 51A, and the second coil surface 52Ab faces the fourth coil surface 52Bb of the second conductive body 52B. The second conductive body 52B is disposed such that the third coil surface 52Ba is in contact with the second insulating base material layer 51B. In the electric element 50, the first coil surface 52Aa of the first conductive body 52A is in contact with the smooth surface of the first insulating base material layer 51A, so that the first coil surface 52Aa is smooth. As a result, the distance between the magnet 53A and the first coil surface 52Aa becomes constant or substantially constant along the winding direction of the coil, and the characteristics become more stable. Additionally, in the electric element 50, the third coil surface 52Ba of the second conductive body 52B is in contact with the smooth surface of the second insulating base material layer 51B, so that the third coil surface 52Ba is smooth. As a result, the distance between the magnet 53B and the third coil surface 52Ba becomes constant or substantially constant along the winding direction of the coil, and the characteristics become more stable.

Sixth Preferred Embodiment

Figure 11:
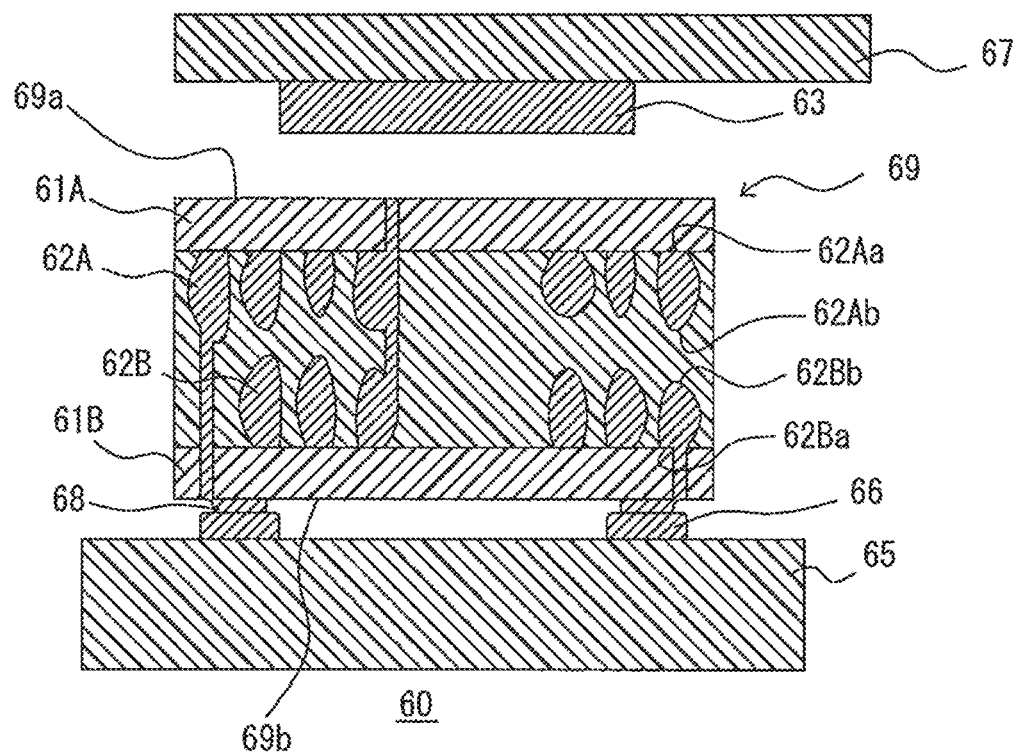
FIG. 11 is an exemplary cross-sectional view of an electric element according to a sixth preferred embodiment of the present invention.

FIG. 11 is a schematic cross-sectional view of an electric element 60 according to a sixth preferred embodiment of the present invention. The electric element 60 according to the sixth preferred embodiment is different from the fourth preferred embodiment in that a substrate 69 is fixed to a housing 65 so as not to move and that a base material 67 including a magnet 63 is configured to be movable. However, the substrate 69 is configured as in the second preferred embodiment. In the electric element 60, a first conductive body 62A is disposed such that a first coil surface 62Aa is in contact with a first insulating base material layer 61A, and a second coil surface 62Ab faces a second coil surface 62Bb of a second conductive body 62B. The second conductive body 62B is disposed such that a first coil surface 62Ba is in contact with a second insulating base material layer 61B.

In FIG. 11, external connection terminals 68 disposed on the second insulating base material layer 61B side of the substrate 69 are bonded to connection terminals 66 disposed on the housing 65 to fix the substrate 69 onto the housing 65. On the side of a first principal surface 69a of the substrate 69, the base material including the magnet 63 is disposed movably in a direction parallel or substantially parallel to the first principal surface 69a of the substrate 69. The magnet 63 is disposed to face the first coil surface that is the contact surface of the first conductive body 62A with the first insulating base material layer 61A. When a drive current is applied to the substrate 69, the base material 67 including the magnet 63 moves in a direction parallel or substantially parallel to the first principal surface 69a of the substrate 69. Therefore, the electric element 60 defines and functions as a linear actuator in which the base material 67 is linearly moved by the drive current. In the electric element 60, the distance between the first coil surface 62Aa of the first conductive body 62A and the magnet 63 is able to be set in a stable state regardless of the thickness in the winding axis direction of the first conductive body 62A, so that the electric element 60 having stable characteristics is able to be provided.

The disclosure of Japanese Patent Application No. 2017-038556 (filed on Mar. 1, 2017) is hereby incorporated by reference in its entirety. All of the documents, patent applications, and technical standards described in this description are hereby incorporated by reference to the same extent as if each of the documents, patent applications, and technical standards is specifically and individually described as being incorporated by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electric element comprising:
   a substrate including a resin layer and a first conductive body including a contact surface in contact with the resin layer; and
   a magnet; wherein
   the substrate includes a smooth first principal surface facing the magnet;
   the first conductive body includes a coil portion that has a winding axis orthogonal or substantially orthogonal to the first principal surface and that is located on a side closest to the first principal surface;
   the coil portion includes a continuous coil conductor including a first coil surface facing the first principal surface and a second coil surface opposite to the first coil surface;
   the coil conductor has a non-uniform thickness in a winding axis direction varying a distance between the first coil surface and the second coil surface along a winding direction; and
   a difference of a maximum value and a minimum value of distance between the first coil surface and the first principal surface is smaller than a difference of a maximum value and a minimum value of distance between the second coil surface and the first principal surface.

2. The electric element according to claim 1, wherein the coil conductor has an average value of about 1 or more of a ratio of a thickness in the winding axis direction to a thickness in a width direction orthogonal or substantially orthogonal to the winding axis direction and the winding direction.

3. The electric element according to claim 1, wherein the coil portion has an average value of about 0.5 or less of a ratio of a gap between adjacent portions of the coil conductor to a thickness in the winding axis direction of one of the portions of the coil conductor.

4. The electric element according to claim 1, wherein an average value of the distance between the first principal surface and the first coil surface is smaller than the minimum value of the distance between the first coil surface and the second coil surface.

5. The electric element according to claim 1, wherein the coil portion has a planar spiral shape.

6. The electric element according to claim 1, wherein
   the substrate includes a first insulating base material layer including two smooth opposite surfaces;
   one of the two opposite surfaces of the first insulating base material layer defines the first principal surface; and
   the first conductive body is disposed such that the first coil surface is in contact with another of the two opposite surface of the first insulating base material layer.

7. The electric element according to claim 1, wherein
   the substrate includes the first conductive body embedded in the resin layer and includes a smooth second principal surface opposite to the first principal surface;
   the substrate includes a second conductive body embedded on a second principal surface side in the resin layer and connected to the first conductive body;
   the second conductive body includes a coil portion that has a winding axis orthogonal or substantially orthogonal to the second principal surface and that is located on a side closest to the second principal surface; and
   the coil portion of the second conductive body includes a continuous coil conductor including a third coil surface facing the second principal surface and a fourth coil surface opposite to the third coil surface.

8. The electric element according to claim 7, wherein
   the coil conductor of the coil portion of the second conductive body has a non-uniform thickness in the winding axis direction varying a distance between the third coil surface and the fourth coil surface along the winding direction; and
   a difference of a maximum value and a minimum value of distance between the third coil surface and the second principal surface is smaller than a difference of a maximum value and a minimum value of distance between the fourth coil surface and the second principal surface.

9. The electric element according to claim 7, wherein the coil conductor of the coil portion of the second conductive body has an average value of about 1 or more of a ratio of a thickness in the winding axis direction to a thickness in a width direction orthogonal or substantially orthogonal to the winding axis direction and the winding direction.

10. The electric element according to claim 7, wherein the coil portion of the second conductive body has an average value of about 0.5 or less of a ratio of a gap between adjacent portions of the coil conductor to a thickness in the winding axis direction of one of the portions of the coil conductor.

11. The electric element according to claim 7, wherein an average value of the distance between the second principal surface and the third coil surface is smaller than the minimum value of the distance between the third coil surface and the fourth coil surface.

12. The electric element according to claim 7, wherein the coil portion of the second conductive body has a planar spiral shape.

13. The electric element according to claim 7, wherein
   the substrate includes a second insulating base material layer including two smooth opposite surfaces;

one of the two opposite surfaces of the second insulating base material layer defines the second principal surface; and the second conductive body is disposed such that the third coil surface is in contact with another of the two opposite surfaces of the second insulating base material layer.

14. The electric element according to claim 7, further comprising a magnet disposed to face the second principal surface.

15. An electric element comprising:
a substrate including a resin layer, a first conductive body, and a second conductive body including contact surfaces with the resin layer; and
at least two magnets disposed with the substrate interposed therebetween; wherein
the substrate includes smooth first and second principal surfaces respectively facing the magnets;
the first conductive body includes a first coil portion that has a winding axis orthogonal or substantially orthogonal to the first principal surface and that is located on a side closest to the first principal surface;
the first coil portion includes a continuous first coil conductor including a first coil surface facing the first principal surface and a second coil surface opposite to the first coil surface;
the first coil conductor has a non-uniform thickness in a winding axis direction varying a distance between the first coil surface and the second coil surface along a winding direction;
a difference of a maximum value and a minimum value of distance between the first coil surface and the first principal surface is smaller than a difference of a maximum value and a minimum value of distance between the second coil surface and the first principal surface;
the second conductive body includes a second coil portion that has a winding axis orthogonal or substantially orthogonal to the second principal surface and that is located on a side closest to the second principal surface;
the second coil portion includes a continuous second coil conductor including a third coil surface facing the second principal surface and a fourth coil surface opposite to the third coil surface;
the second coil conductor has a non-uniform thickness in a winding axis direction varying a distance between the third coil surface and the fourth coil surface along a winding direction; and
a difference of a maximum value and a minimum value of distance between the third coil surface and the second principal surface is smaller than a difference of a maximum value and a minimum value of distance between the fourth coil surface and the second principal surface.

16. The electric element according to claim 1, wherein at least one of the first and second coil conductors has an average value of about 1 or more of a ratio of a thickness in the winding axis direction to a thickness in a width direction orthogonal or substantially orthogonal to the winding axis direction and the winding direction.

17. The electric element according to claim 15, wherein at least one of the coil portion has an average value of about 0.5 or less of a ratio of a gap between adjacent portions of the coil conductor to a thickness in the winding axis direction of one of the portions of the coil conductor.

18. The electric element according to claim 1, wherein an average value of the distance between the first principal surface and the first coil surface is smaller than the minimum value of the distance between the first coil surface and the second coil surface.

19. The electric element according to claim 1, wherein an average value of the distance between the second principal surface and the third coil surface is smaller than the minimum value of the distance between the third coil surface and the fourth coil surface.

20. The electric element according to claim 1, wherein at least one of the first and second coil portions has a planar spiral shape.

* * * * *